US010314177B2

(12) United States Patent
Yamada et al.

(10) Patent No.: US 10,314,177 B2
(45) Date of Patent: Jun. 4, 2019

(54) COMPONENT MOUNTING METHOD

(71) Applicant: Panasonic Intellectual Property Management Co., Ltd., Osaka (JP)

(72) Inventors: Shingo Yamada, Yamanashi (JP); Takafumi Tsujisawa, Yamanashi (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 352 days.

(21) Appl. No.: 15/092,261

(22) Filed: Apr. 6, 2016

(65) Prior Publication Data
US 2016/0302337 A1 Oct. 13, 2016

(30) Foreign Application Priority Data

Apr. 9, 2015 (JP) ................. 2015-079691

(51) Int. Cl.
*H05K 3/30* (2006.01)
*G02F 1/13* (2006.01)
*H05K 1/02* (2006.01)
*H05K 3/32* (2006.01)

(52) U.S. Cl.
CPC ............ *H05K 3/30* (2013.01); *G02F 1/1303* (2013.01); *H05K 1/0269* (2013.01); *H05K 3/323* (2013.01); *H05K 2201/10136* (2013.01)

(58) Field of Classification Search
CPC .... H05K 13/04; H05K 13/08; H05K 13/0015; H05K 13/0413; H05K 1/0269; H05K 3/30; H05K 3/323; H05K 2201/10136; G02F 1/1303
See application file for complete search history.

(56) References Cited

U.S. PATENT DOCUMENTS

2011/0133345 A1* 6/2011 Tasaki ............. G06K 19/07749
257/783

FOREIGN PATENT DOCUMENTS

JP 3333001 B2 * 10/2002
JP 3620868 B2 * 2/2005
JP 5017041 B2 6/2012

* cited by examiner

Primary Examiner — Carl J Arbes
(74) Attorney, Agent, or Firm — Pearne & Gordon LLP

(57) ABSTRACT

A component mounting apparatus is configured to mount a component on a substrate. The substrate includes a lower side substrate member, an upper side substrate member provided on an upper surface of the lower side substrate member, a lower side mark provided on the lower side substrate member, and an upper side mark provided on an upper surface of the upper side substrate member. The apparatus includes an upward facing camera configured to image the lower side mark from below the lower side substrate member, a data storage configured to store relative positional relationship data indicating a predetermined relative positional relationship between the lower side mark and the upper side mark, and a component mounting unit configured to mount the component on the upper surface of the upper side substrate member based on the data and information obtained through imaging the lower side mark imaged by the upward facing camera.

6 Claims, 23 Drawing Sheets

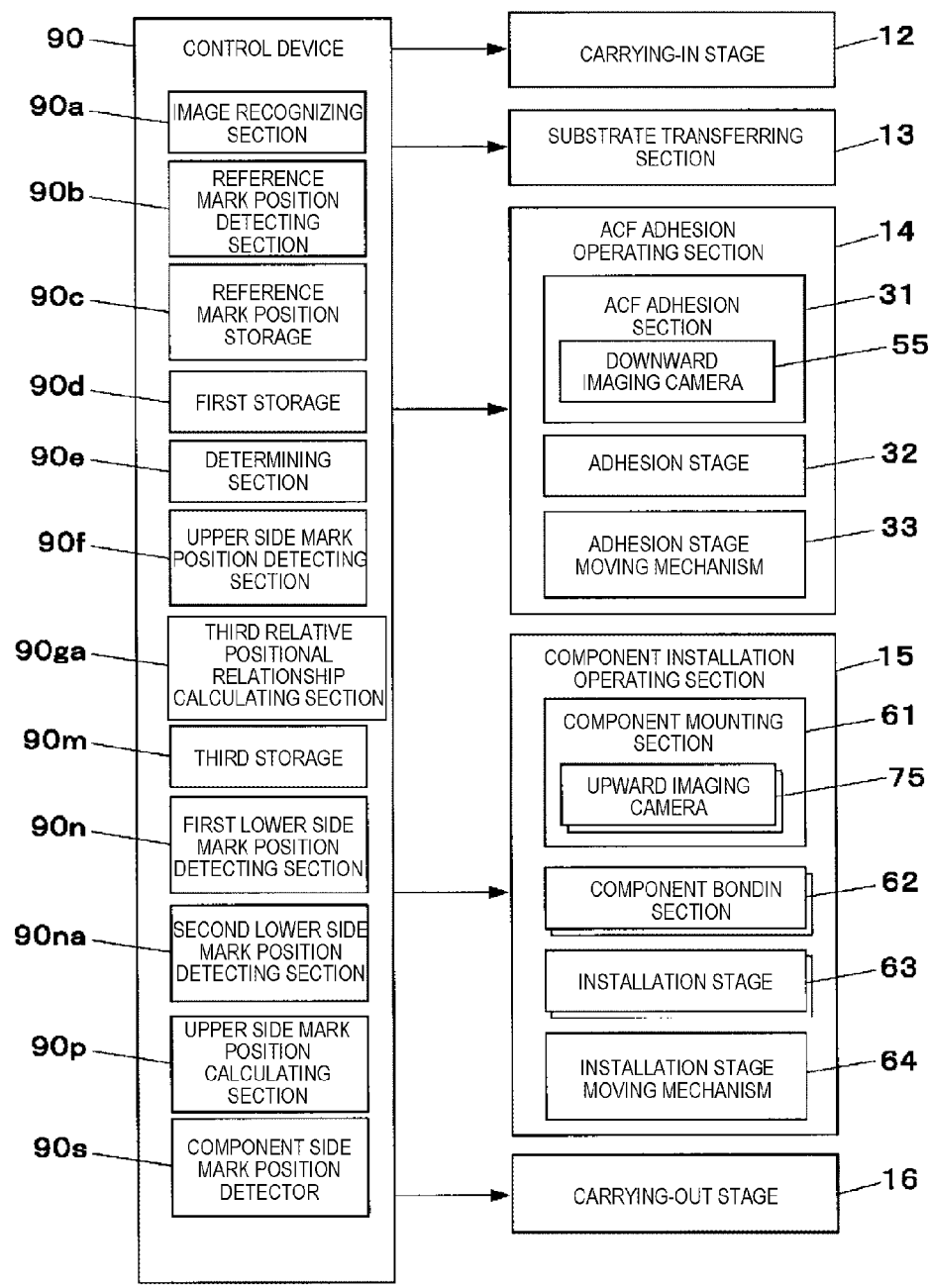

COMPONENT MOUNTING METHOD

BACKGROUND OF THE INVENTION

1. Field of the Invention

The present invention relates to a component mounting apparatus and a component mounting method in which a component is mounted on a substrate.

2. Description of the Related Art

In the related art, a component mounting apparatus for manufacturing a substrate of a liquid crystal panel includes an anisotropic conductive film (ACF) adhesion section that adheres a tape-shaped ACF as an adhesive on an end portion of the substrate, a component mounting section that mounts a component having a film-shaped portion, such as a drive circuit, in a portion of the substrate, to which the ACF adheres, and a component bonding section that performs pressure bonding of the component mounted by the component mounting section, to the substrate (for example, Japanese Patent No. 5017041).

The component mounting section includes an upward facing camera having an above-positioned imaging field and mounts a component on the substrate on the basis of a position of a substrate-side mark imaged from below by the upward facing camera. The component bonding section presses the component so as to perform pressure bonding of the component to the substrate, with a pressing tool lowered from above the component mounted on the substrate.

SUMMARY

A component mounting apparatus is configured to mount a component on a substrate, wherein the substrate includes a lower side substrate member, an upper side substrate member provided on an upper surface of the lower side substrate member, a lower side mark provided on the lower side substrate member, and an upper side mark provided on an upper surface of the upper side substrate member. The component mounting apparatus includes an upward facing camera configured to image the lower side mark from below the lower side substrate member, a data storage configured to store relative positional relationship data indicating a predetermined relative positional relationship between the lower side mark and the upper side mark, and a component mounting unit configure to mount the component on the upper surface of the upper side substrate member based on the relative positional relationship data and information obtained through imaging the lower side mark imaged by the upward facing camera.

This component mounting apparatus can mount the component on the upper side substrate member without providing a camera for imaging the upper side mark from above.

BRIEF DESCRIPTION OF DRAWINGS

FIG. 17 is a block diagram illustrating a control system of a component mounting apparatus according to a modification example of the embodiment.

DETAILED DESCRIPTION OF THE EMBODIMENT

Figure 1:
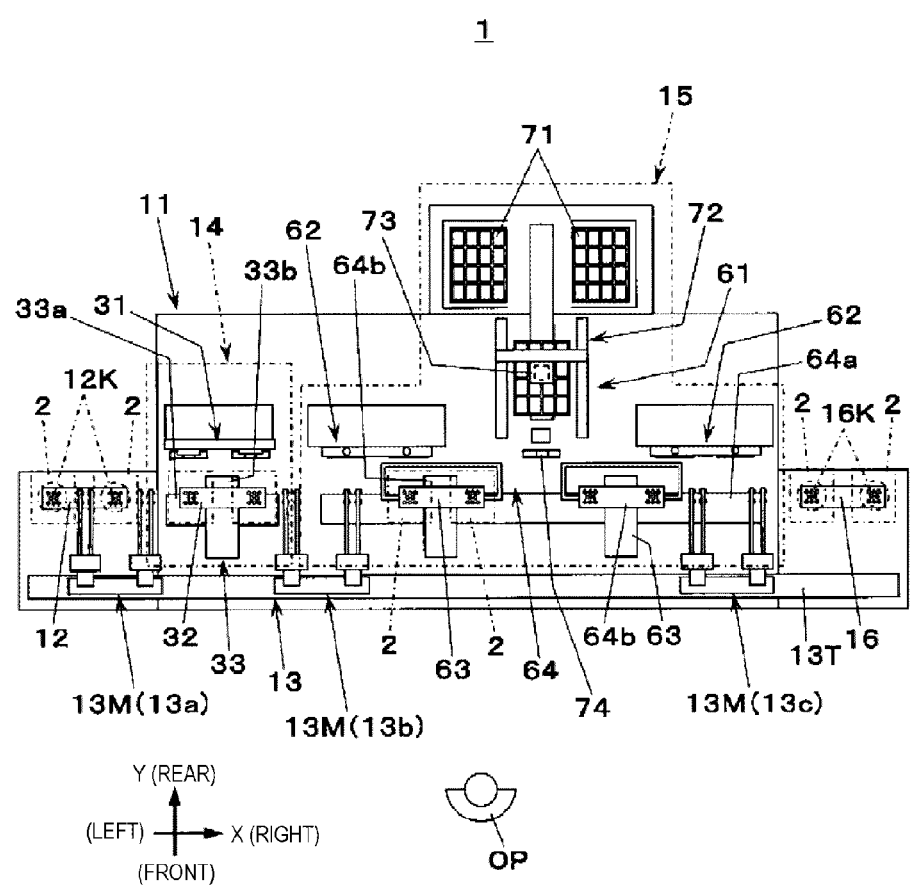
FIG. 1 is a plan view of a component mounting apparatus according to an embodiment of the invention.

In a component mounting apparatus in the related art described above, a substrate has a two-layer structure in which two upper and lower substrate members are stacked and, normally, a component is mounted on the substrate member on the lower side; however, in recent years, as in a substrate of an on-cell type touch panel, components have been mounted not only on the lower side substrate member, but also on an upper side substrate member of the substrate. In a case of manufacturing such a substrate, a prior mounting component (for example, a display driving component) is mounted on the lower side substrate member in the mounting process described above, and then a posterior mounting component (for example, an on-cell touch panel driving component) is mounted on the upper side substrate member. When the posterior mounting component is mounted on the upper side substrate member, it is not possible to image an upper side mark provided on the upper surface of the upper side substrate member by a upward facing camera (camera having above-positioned imaging field). Therefore, the downward facing camera (camera having below-positioned imaging field), which images the upper side mark from above, needs to be separately provided.

However, the downward facing camera, which images the upper side mark of the substrate from above, and is separately provided in a component mounting section, results in a concern that costs of the component mounting apparatus will be increased.

Hereinafter, an embodiment of the invention will be described with reference to the drawings. In manufacturing a liquid crystal panel substrate or the like, a film-like component (in FIG. 2, referred to as prior mounting component 3A) is mounted on substrate 2 in advance, and then component mounting apparatus 1 illustrated in FIG. 1 mounts another film-like component (in FIG. 2, referred to as posterior mounting component 3B) on substrate 2.

Substrate 2 has lower side substrate member 2a and upper side substrate member 2b provided on the upper surface of lower side substrate member 2a. Prior mounting component 3A is mounted on lower side substrate member 2a with reference to a pair of lower side marks 2m (FIG. 2) provided on the upper surface of lower side substrate member 2a. Posterior mounting component 3B is mounted on electrode 2d (FIG. 2) provided on the upper surface of the upper side substrate member 2b. The pair of upper side marks 2M (FIG. 2) are provided at positions which interpose electrode 2d from the right and left, and posterior mounting component 3B is mounted on the upper surface of the upper side substrate member 2b with a target region between the pair of upper side marks 2M with reference to the pair of upper side marks 2M.

In the mounting of posterior mounting component 3B, first, ACF 4 as an adhesive adheres over electrode 2d provided on the upper surface of upper side substrate member 2b and posterior mounting component 3B is mounted and is subjected to pressure adhesion on ACF 4. In the present embodiment, mounting and pressure bonding of the film-like component are collectively referred to as "installation of a component".

Figure 2:
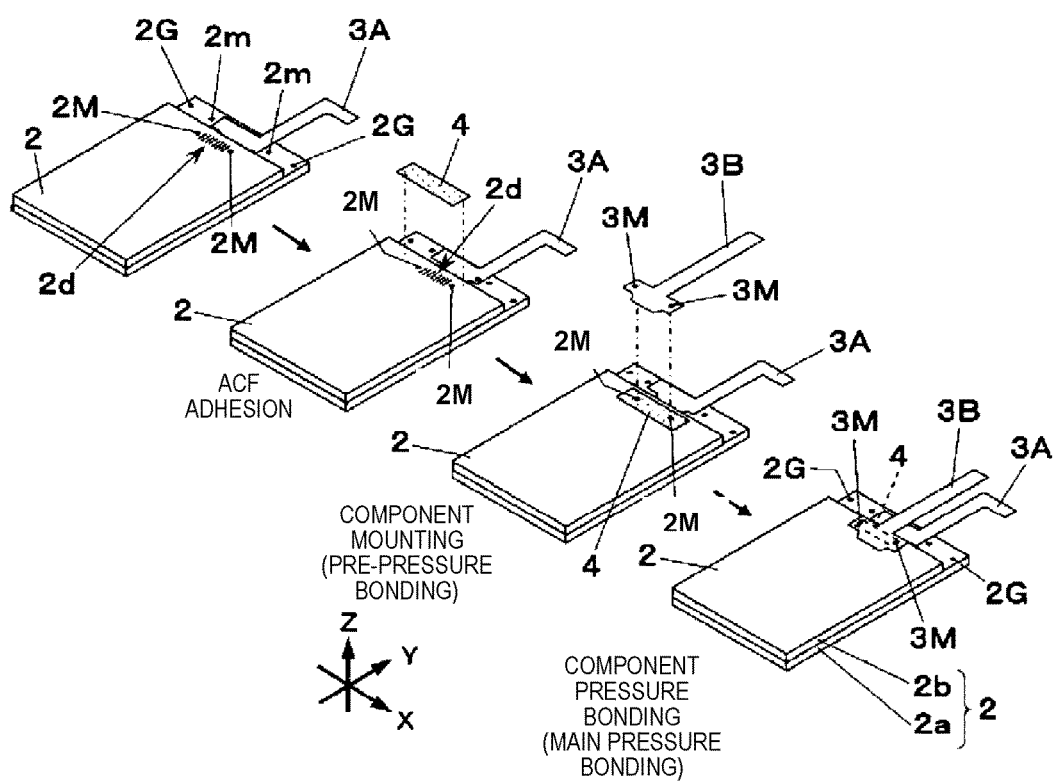
FIG. 2 is a view illustrating a progression procedure of a component mounting operation on a substrate by the component mounting apparatus according to the embodiment.

In FIG. 1, component mounting apparatus 1 includes carrying-in stage 12, substrate transferring section 13, ACF adhesion operation section 14, component installation operation section 15, and carrying-out stage 16 on base 11. In the present embodiment, the front side of component mounting apparatus 1 viewed by operator OP is referred to as the front side of component mounting apparatus 1 and the back side of component mounting apparatus 1 viewed by operator OP is referred to as the rear side of component mounting apparatus 1. In addition, the left side of component mounting apparatus 1 viewed by operator OP is referred to as the left side of component mounting apparatus 1 and the right side of component mounting apparatus 1 viewed by operator OP is referred to as the right side of component mounting apparatus 1. Further, the right-left direction of component mounting apparatus 1 is referred to as an X-axial direction, the frontward-rearward direction is referred to as a Y-axial direction, and the vertical direction is referred to as a Z-axial direction.

In FIG. 1, carrying-in stage 12 is provided on the left end portion of base 11. In carrying-in stage 12, one or two (here, two) substrates 2, which are carried in by a substrate carrying-in unit (not illustrated) from another apparatus on a upstream process side, are suctioned and held by carrying-in stage suctioning port 12K provided as an opening in the upper surfaces of both end portions of the carrying-in stage 12 in the X-axial direction.

Figure 3:
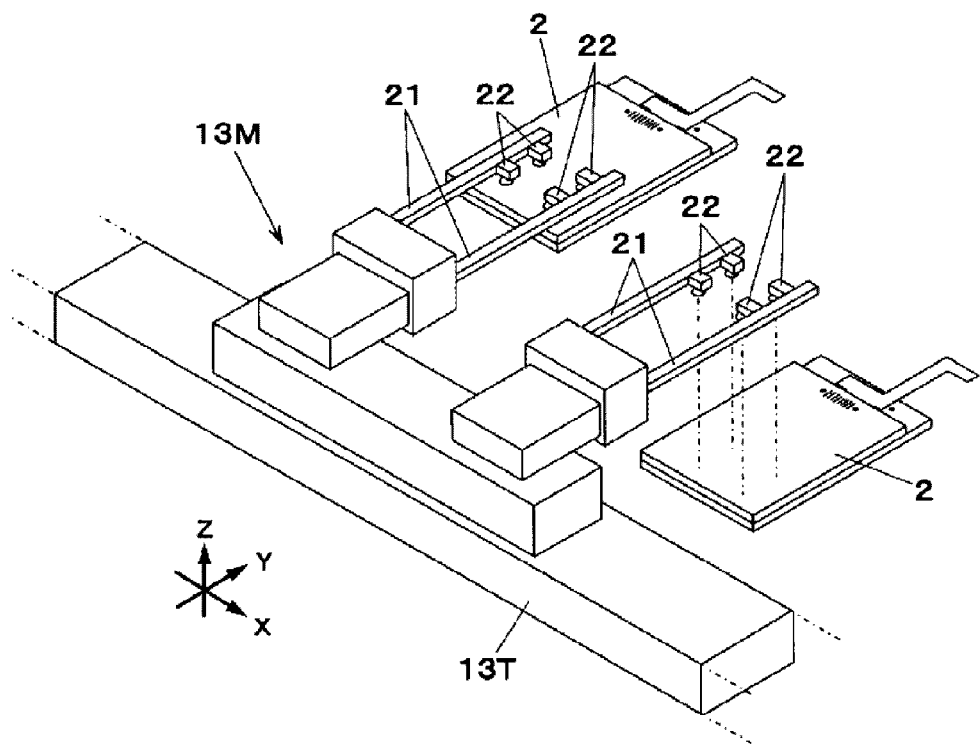
FIG. 3 is a perspective view of a substrate transfer member which is included in the component mounting apparatus according to the embodiment.

In FIG. 1, substrate transferring section 13 is provided in the forwardmost region of base 11. Substrate transferring section 13 has a configuration in which three substrate transfer members 13M are movable in the X-axial direction on transfer member moving table 13T which is provided to extend in the X-axial direction. Three substrate transfer members 13M are referred to as left transfer member 13a, center transfer member 13b, and right transfer member 13c, from the left side. Each substrate transfer member 13M has a plurality of suction arms 21 extending rearward and each suction arm 21 is provided with a plurality of suction section 22 having downward suction ports, respectively (FIG. 3).

In each substrate transfer member 13M, suction section 22 suctions (picks up) substrate 2 from above and the substrate transfer member is driven by transfer member moving table 13T so as to move in the X-axial direction and transfers substrate 2. Here, a case in which each substrate transfer member 13M suctions two substrates 2 at once is described; however, it is possible to suction one large-sized substrate 2.

In FIG. 1, ACF adhesion operation section 14 is provided in a right side region from the carrying-in stage 12 and includes ACF adhesion section 31, adhesion stage 32, and adhesion stage moving mechanism 33. ACF adhesion operation section 14 is an ACF adhering device which performs adhesion of ACF 4 to substrate 2.

Figure 4A:
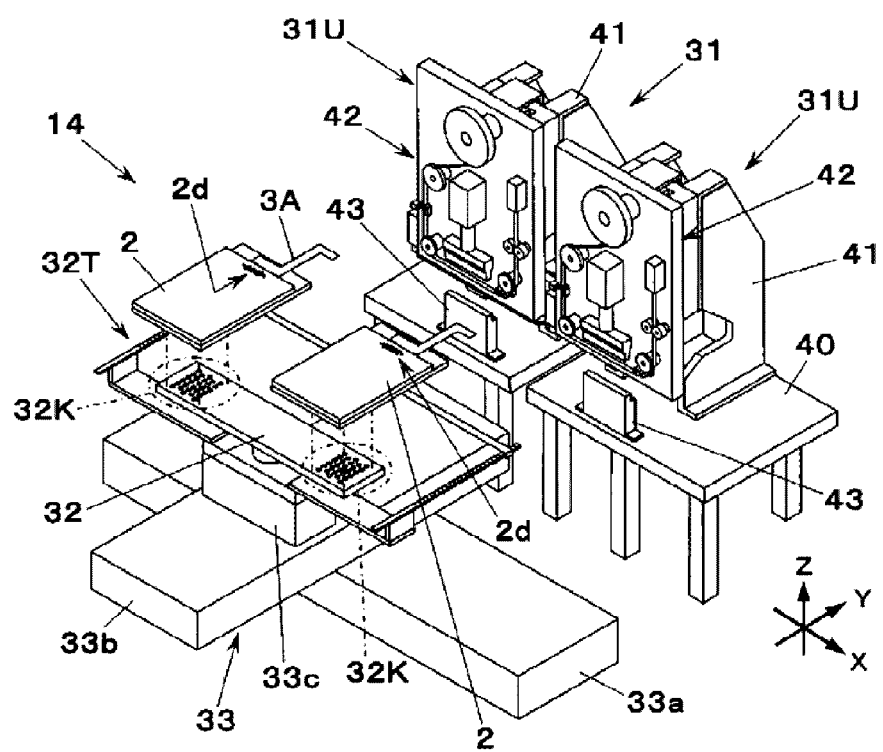
FIGS. 4A and 4B are perspective views illustrating an adhesion stage moving mechanism and an ACF adhesion section which is included in the component mounting apparatus according to the embodiment.
Figure 4B:
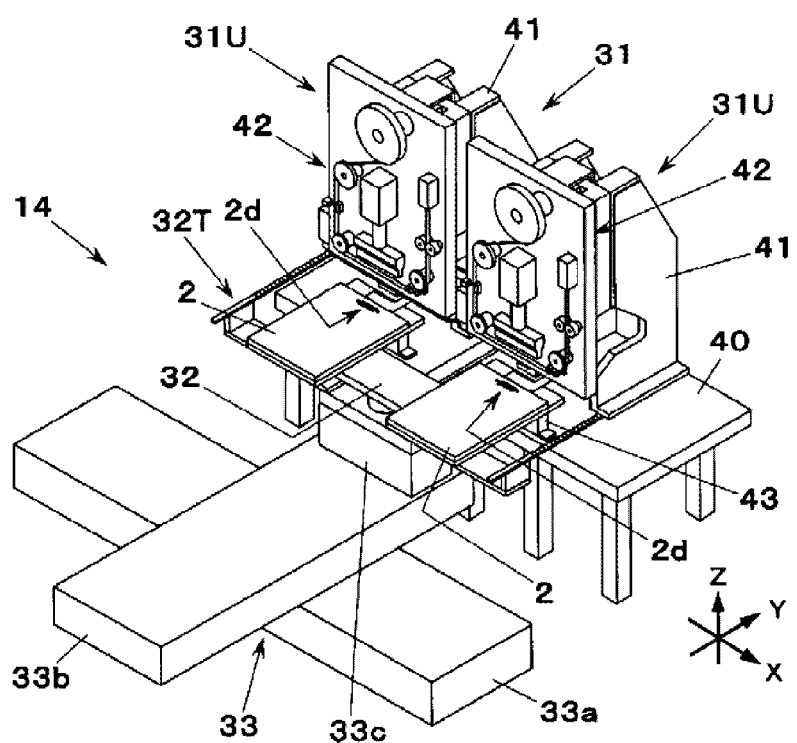
Figure 5:
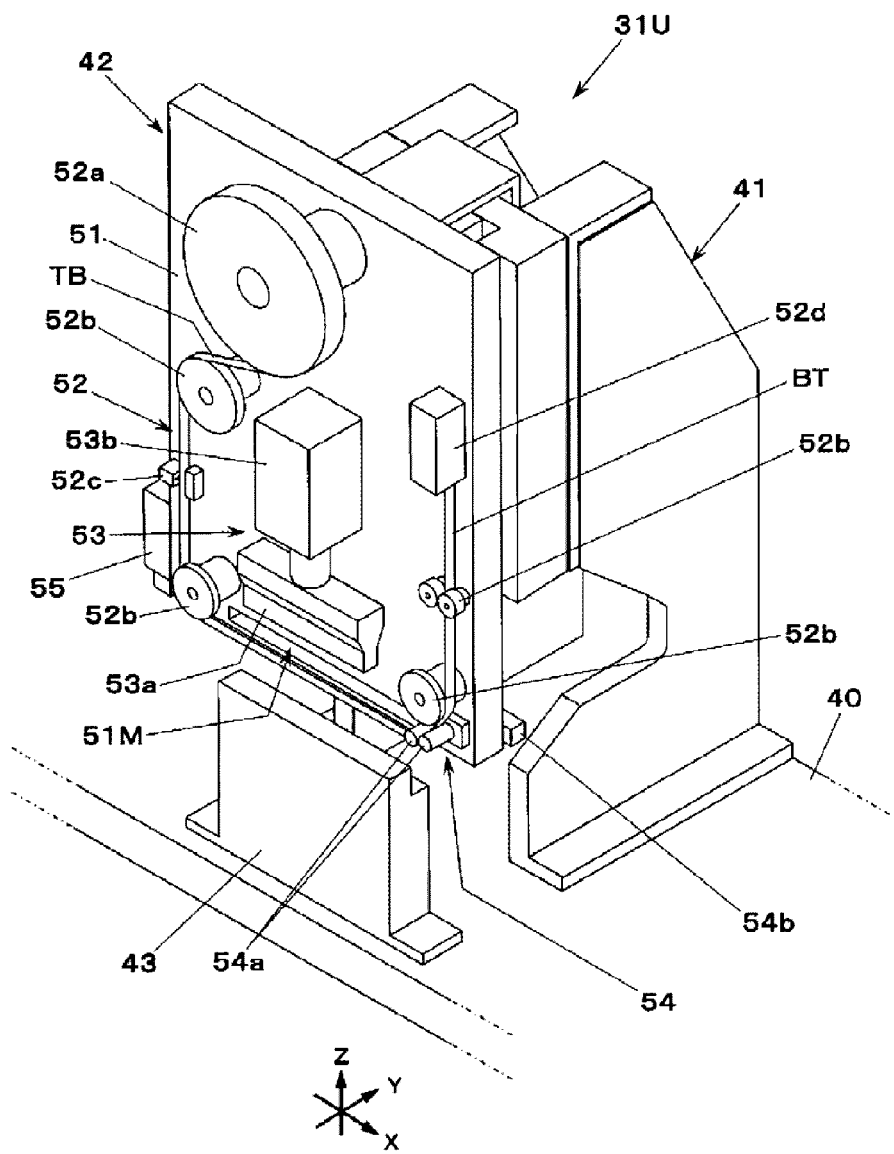
FIG. 5 is a partial perspective view of the ACF adhesion section which is included in the component mounting apparatus according to the embodiment.

In FIGS. 4A and 4B, ACF adhering section 31 includes two ACF adhering units 31U provided in parallel in the X-axial direction and each ACF adhering unit 31U performs adhesion of ACF 4 to the upper surface of upper side substrate member 2b of each substrate 2. As illustrated in FIGS. 4A to 5, each ACF adhering unit 31U includes platform-like base section 40, head support 41 provided in the base section 40, adhesion head 42 attached to head support 41, and adhesion support base 43 provided in the base section 40.

In FIG. 5, adhesion head 42 includes tape transporting section 52, pressing section 53, and peeling section 54 on base plate 51. Tape transport section 52 is configured to include tape supply reel 52a, a plurality of roll members 52b, cutter 52c, and collector 52d. Tape supply reel 52a unwinds and supplies tape member TB in which tape-shaped ACF 4 is laminated on base tape BT. The plurality of roll members 52b guide and transport tape member TB which is supplied by tape supply reel 52a. Cutter 52c makes notches and cuts, at predetermined intervals, tape-shaped ACF 4 on base tape BT. Collector 52d suctions and collects base tape BT after cut ACF 4 is separated.

In FIG. 5, pressing section 53 includes pressing tool 53a and tool lifting-lowering cylinder 53b which causes pressing tool 53a to be lifted or lowered. Peeling section 54 includes peeling member 54a with tape member TB (specifically, base tape BT), which is transported by tape transporting section 52, interposed between a pair of pin members, and peeling cylinder 54b which causes peeling member 54a to move in the X-axial direction along movement groove 51M provided to a lower part of the base plate 51.

In FIG. 5, adhesion head 42 includes downward facing camera 55 having below-positioned imaging field on a left end portion of the base plate 51. As will be described below, downward facing camera 55 is not only used to perform a recognition for a position of substrate 2 held in adhesion stage 32 with respect to adhesion stage 32, but is also used to check that ACF 4 appropriately adheres to electrode 2d after ACF 4 adheres to substrate 2.

In FIG. 4A, adhesion stage 32 includes adhering stage suctioning port 32K, which opens in the upper surface, on both end portions in the X-axial direction. In adhesion stage 32, adhering stage suctioning port 32K suctions and holds the under surface of substrate 2 transferred from carrying-in stage 12 by left transfer member 13a.

In FIG. 1, adhesion stage moving mechanism 33 is provided in a front region from ACF adhering section 31. As illustrated in FIGS. 4A and 4B, adhesion stage moving mechanism 33 includes X-axis movement table 33a disposed to extend in the X-axial direction, Y-axis movement table 33b which is caused to move in a transverse direction (X-axial direction) by X-axis movement table 33a, and lifting-lowering rotation table 33c which is caused to move in the frontward-rearward direction (Y-axial direction) by Y-axis movement table 33b. Adhesion stage 32 is attached to the lifting-lowering rotation table 33c.

X-axis movement table 33a causes Y-axis movement table 33b to move in the transverse direction (X-axial direction), Y-axis movement table 33b causes lifting-lowering rotation table 33c to move in the frontward-rearward direction (Y-axial direction), and thereby adhesion stage 32 moves in an XY plane. In addition, lifting-lowering rotation table 33c operates, and thereby adhesion stage 32 is lifted or lowered and is rotated in the XY plane. In other words, adhesion stage moving mechanism 33 is an adhesion stage moving unit which causes adhesion stage 32 to move in a direction in the XY plane and in the vertical direction.

Adhesion stage 32 moves between a "substrate transfer position" (position illustrated in FIG. 4A), at which reception and delivery of substrate 2 are performed through a movement operation of lifting-lowering rotation table 33c by Y-axis movement table 33b in the frontward-rearward direction, and an "operational position" (position illustrated in FIG. 4B), on the rear side from the substrate transfer position. In a state in which adhesion stage 32 is positioned at the operational position, a rear end portion (region under electrode 2d) of substrate 2 held in adhesion stage 32 is positioned above adhesion support base 43 (below adhesion head 42).

As illustrated in FIG. 4A and FIG. 4B, component support 32T is provided in adhesion stage 32 so as to extend rearward. Component support 32T supports, from below, a portion of prior mounting component 3A which is mounted on substrate 2 in advance, which projects out from a rear portion of substrate 2.

In FIG. 1, component installation operator 15 is provided in a right side region from ACF adhesion operation section 14 and includes component mounting section 61, two component bonding section 62, two installation stages 63, and installation stage moving mechanism 64. Component mounting section 61 is a component mounting device which mounts posterior mounting component 3B on upper side substrate member 2b of substrate 2 to which ACF 4 adheres. In addition, component bonding section 62 is a component bonding device which performs pressure bonding of posterior mounting component 3B mounted by component mounting section 61 on upper side substrate member 2b of substrate 2.

Figure 6A:
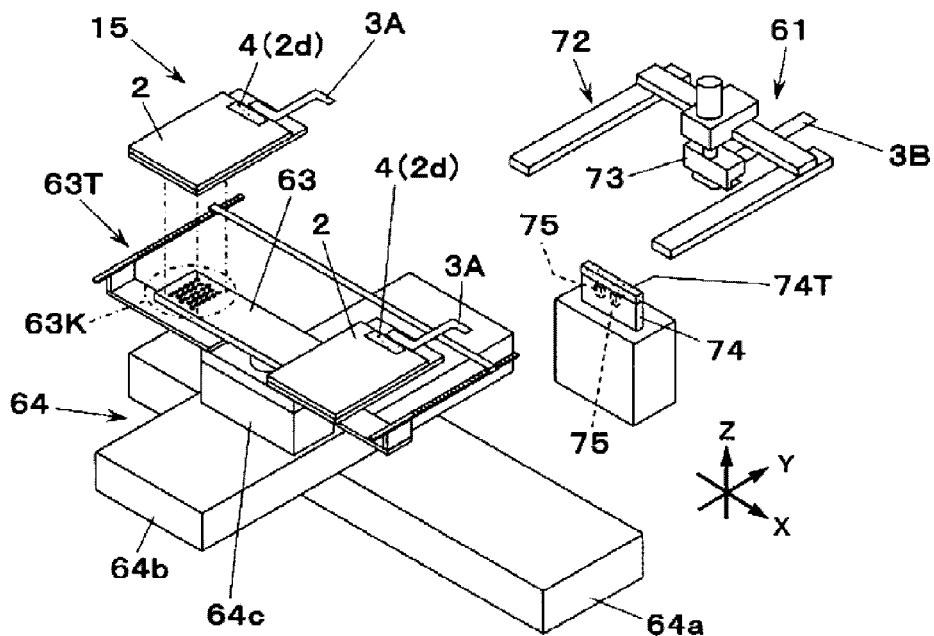
FIGS. 6A and 6B are perspective views illustrating an installation stage moving mechanism and a component mounting section which is included in the component mounting apparatus according to the embodiment.
Figure 6B:
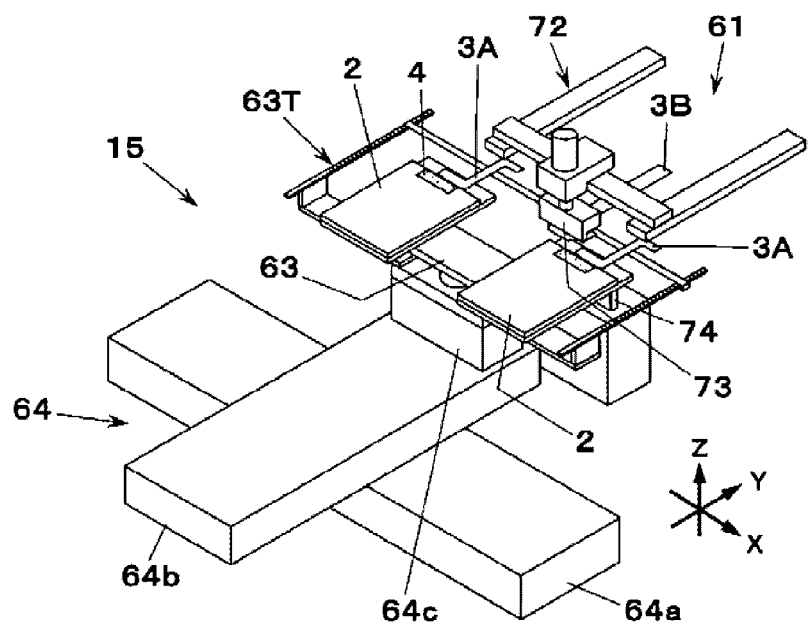

As illustrated in FIG. 1 and FIGS. 6A and 6B, component mounting section 61 includes component supplying section 71 which supplies posterior mounting component 3B, mounting head moving mechanism 72, mounting head 73 (component mounting unit) which is caused to move by mounting head moving mechanism 72, mounting support base 74 provided below mounting head 73, and two upward facing cameras 75 having an above-positioned imaging field. In FIG. 6A, two upward facing cameras 75 are provided on both sides of mounting support base 74 in the rightward-leftward direction. Two upward facing cameras 75 perform imaging through transparent section 74T such as quartz glass provided on mounting support base 74. As will be described below, upward facing camera 75 is used to perform recognition for a position of substrate 2 held by installation stage 63, on installation stage 63.

Figure 7A:
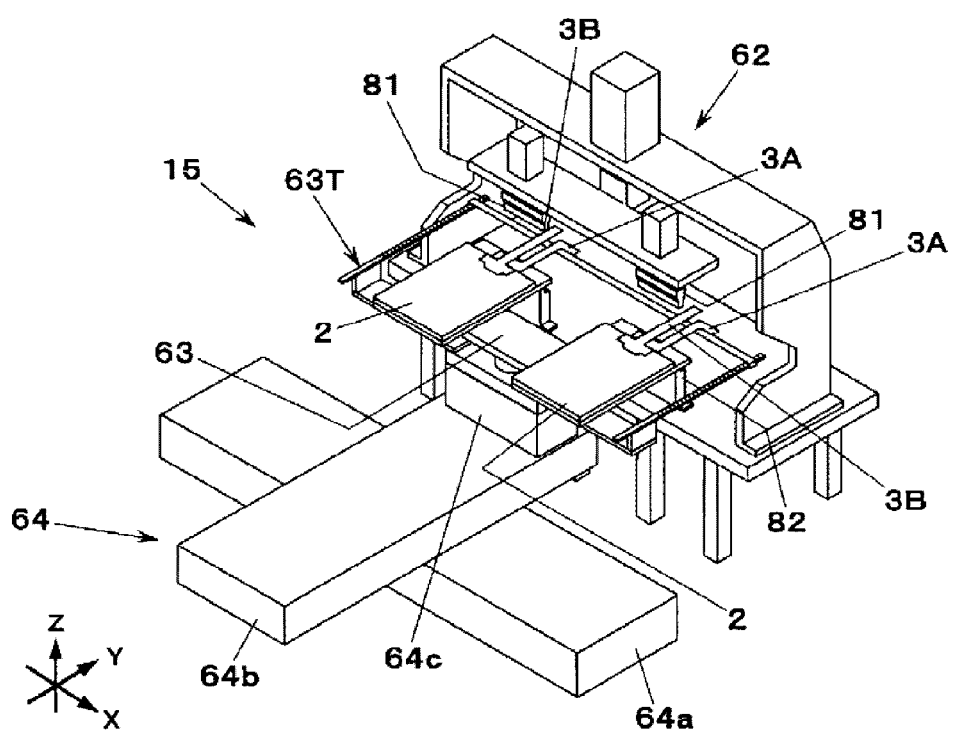
FIGS. 7A and 7B are perspective views illustrating the installation stage moving mechanism and a component bonding section which is included in the component mounting apparatus according to the embodiment.
Figure 7B:
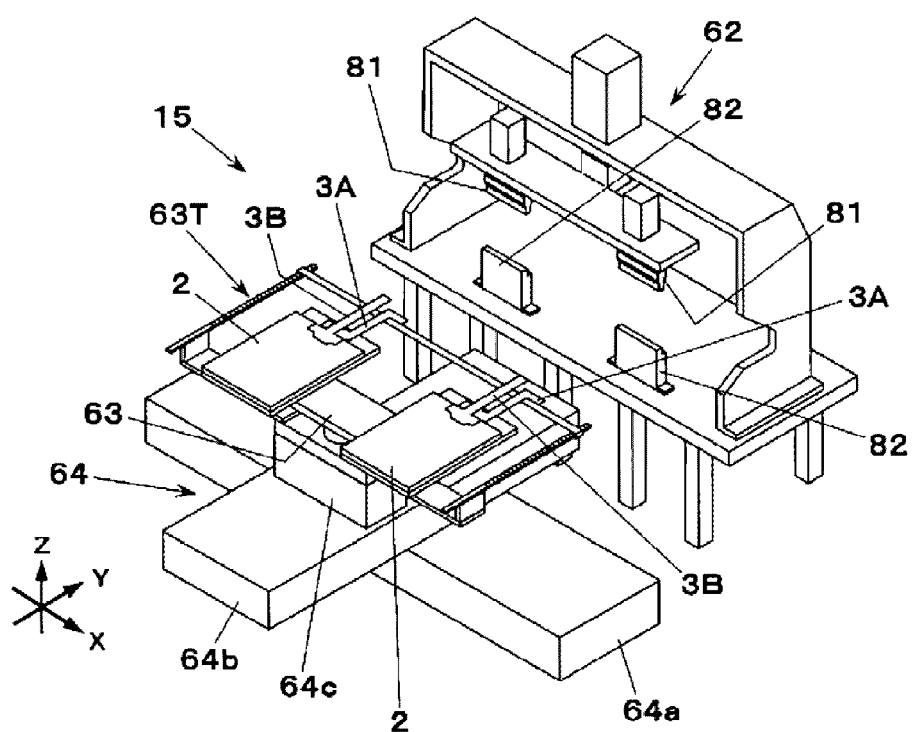

In FIG. 1, two component bonding section 62 are provided at positions which interpose component mounting section 61 from both sides in the right-left direction. In FIGS. 7A and 7B, each component bonding section 62 includes two bonding heads 81 provided in parallel in the X-axial direction and two pressure adhesion support base 82 provided below each bonding head 81.

In FIG. 6A, installation stage 63 includes installation stage suctioning port 63k, which opens in the upper surface, on both end portions in the X-axial direction. In installation stage 63, installation stage suctioning port 63k suctions and holds the under surface of substrate 2 transferred from adhesion stage 32 by center transfer member 13b.

In FIG. 1, installation stage moving mechanism 64 is provided over a front region from component mounting section 61 and in a front region of two component bonding section 62. As illustrated in FIGS. 6A and 6B, installation stage moving mechanism 64 includes X-axis movement table 64a disposed to extend in the X-axial direction, two Y-axis movement tables 64b which are caused to move in the transverse direction (X-axial direction) by X-axis movement table 64a, and two lifting-lowering rotation tables 64c which are caused to move in the frontward-rearward direction (Y-axial direction) by Y-axis movement table 64b. Two installation stages 63 are attached to the lifting-lowering rotation table 64c, respectively.

X-axis movement table 64a causes Y-axis movement table 64b to move in the transverse direction (X-axial direction), Y-axis movement table 64b causes lifting-lowering rotation table 64c to move in the frontward-rearward direction (Y-axial direction), thereby moving installation stage 63 in the XY plane. In addition, lifting-lowering rotation table 64c operates, and thereby installation stage 63 is lifted or lowered and is rotated in the XY plane. In other words, installation stage moving mechanism 64 is an installation stage moving unit which causes installation stage 63 to move in a direction in the XY plane and in the vertical direction.

Installation stage 63 moves between a "substrate transfer position" (position illustrated in FIG. 6A), at which reception and delivery of substrate 2 are performed through a movement operation of lifting-lowering rotation table 64c by Y-axis movement table 64b in the frontward-rearward direction, and an "operational position" "(position illustrated in FIG. 6B), on the rear side from the substrate transfer position. In a state in which installation stage 63 is positioned at the operational position in the front region from component mounting section 61, a rear end portion (region under electrode 2d) of substrate 2 held in installation stage 63 is positioned above mounting support base 74 (below mounting head 73). In addition, in a state in which installation stage 63 is positioned at the operational position in the front region from component bonding section 62, a rear end portion (region under electrode 2d) of substrate 2 held in installation stage 63 is positioned above bonding support base 82. Further, installation stage 63 is caused to move in the X-axial direction from the state in which substrate 2 is positioned above mounting support base 74, thereby making it possible to position substrate 2, as is, above bonding support base 82 (FIG. 7A).

As illustrated in FIGS. 6A to 7B, component support 63T is provided in installation stage 63 so as to extend rearward. Component support 63T supports, from below, a portion of prior mounting component 3A which is mounted on substrate 2 in advance, which projects out from a rear portion of substrate 2, and a portion of posterior mounting component 3B which is newly mounted on substrate 2, which projects out from a rear portion of substrate 2.

In FIG. 1, carrying-out stage 16 is provided in a right side region (right end portion of base 11) of component installation operation section 15. In carrying-out stage 16, substrates 2 transferred from installation stage 63 by right transfer member 13c is suctioned and held by carrying-out stage suctioning port 16K provided as an opening in the upper surfaces of both end portions of the carrying-out stage 16 in the X-axial direction.

Figure 8:
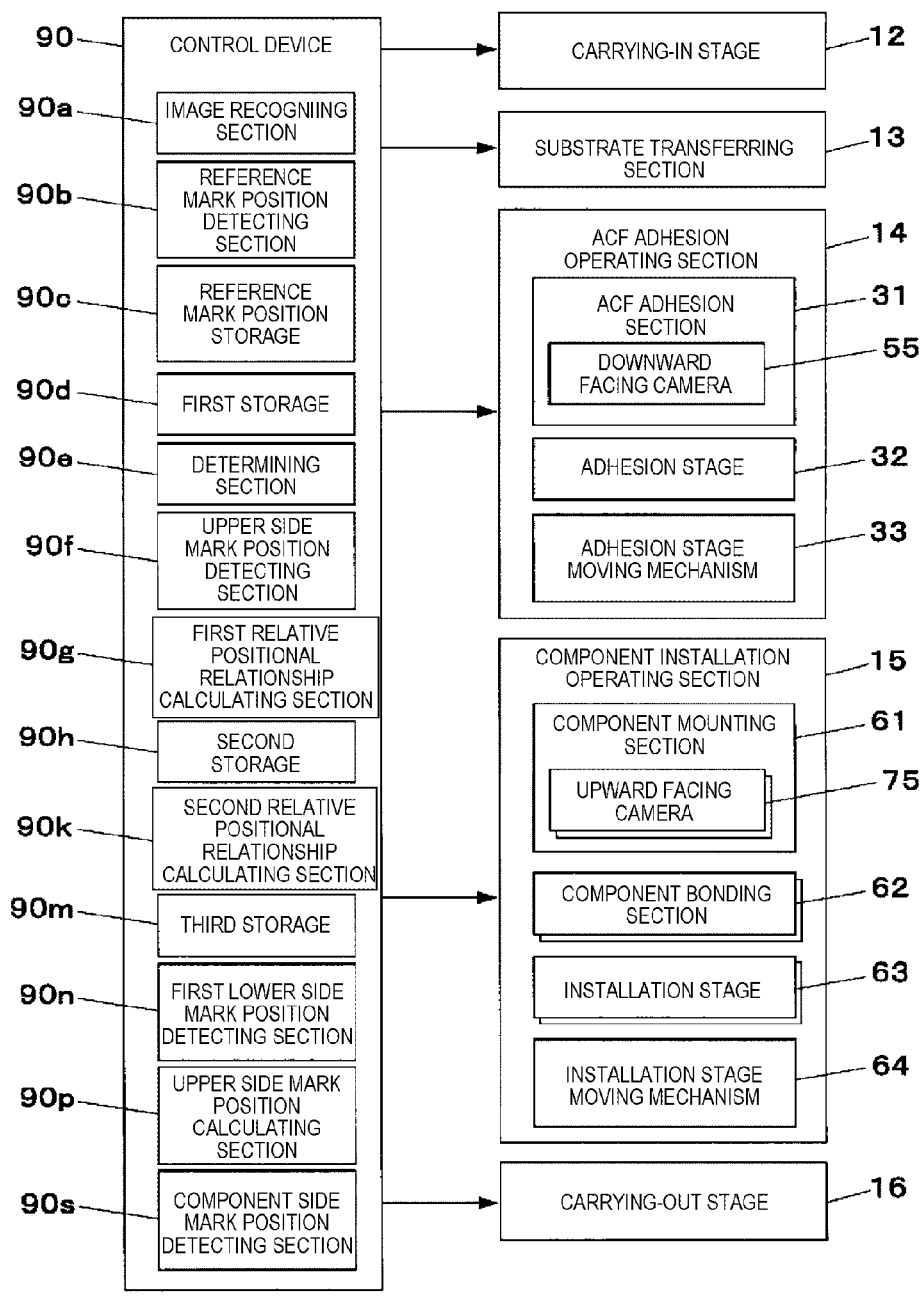
FIG. 8 is a block diagram illustrating a control system of the component mounting apparatus according to the embodiment.

In FIG. 8, control device 90 provided inside base 11 performs control of respective operations of suction of substrate 2 by carrying-in stage 12, transferring of substrate 2 by substrate transferring section 13, adhesion of ACF 4 to substrate 2 by ACF adhesion operation section 14, installation of posterior mounting component 3B to substrate 2 by component installation operation section 15, and suction of substrate 2 by carrying-out stage 16.

Next, an operation of component mounting apparatus 1 (component mounting method by component mounting apparatus 1) will be described. In FIG. 1, when substrate 2 is carried in from the external apparatus by carrying-in stage 12, carrying-in stage 12 suctions and holds substrate 2. Substrate transferring section 13 causes left transfer member 13a to move rearward of carrying-in stage 12 and causes substrate 2 to perform suction on carrying-in stage 12 by suction section 22 of left transfer member 13a. Meanwhile, ACF adhesion operation section 14 causes adhesion stage 32 to be positioned at the substrate transfer position in the front region from ACF adhering section 31. Substrate transferring section 13 causes left transfer member 13a to move rightward when suction section 22 of left transfer member 13a sucks substrate 2 and substrate 2 is transferred to adhesion stage 32.

Figure 9:
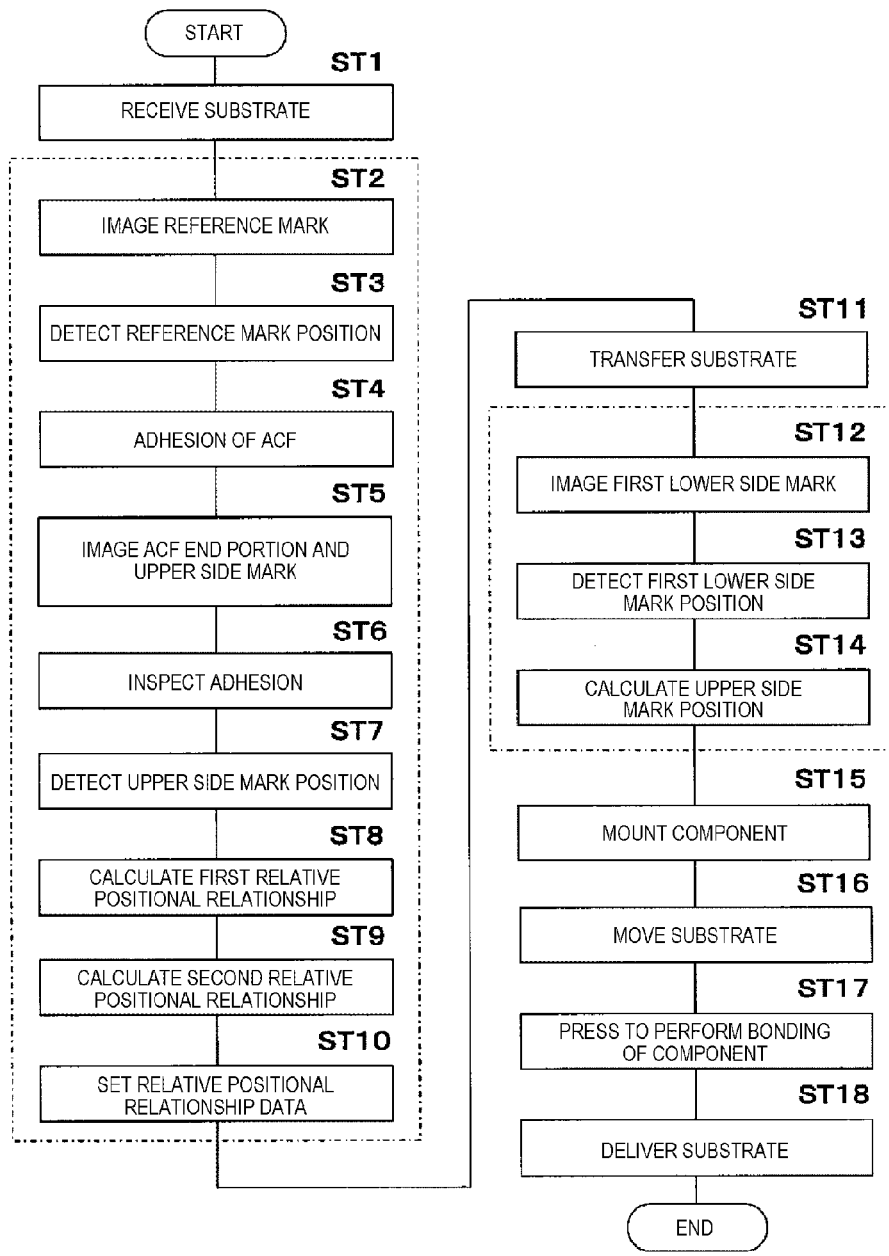
FIG. 9 is a flowchart illustrating flow of the component mounting operation performed by the component mounting apparatus according to the embodiment.
Figure 10A:
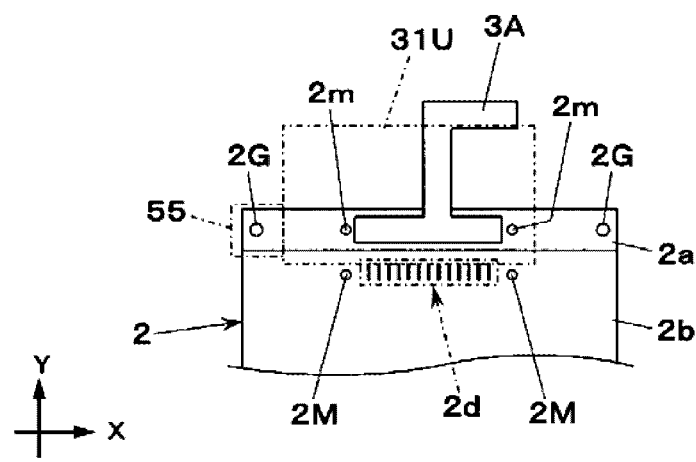
FIGS. 10A and 10B are plan views illustrating states in which a reference mark provided on the substrate is imaged by a downward facing camera of the ACF adhesion section which is included in the component mounting apparatus according to the embodiment.
Figure 10B:
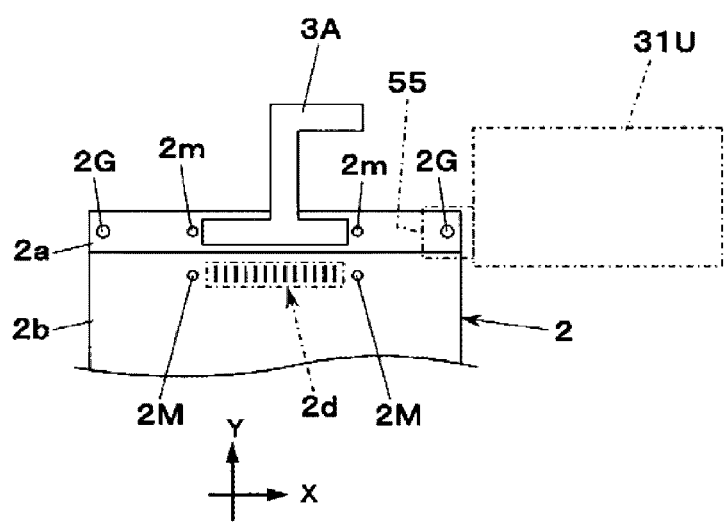

In ACF adhesion operation section 14, adhesion stage 32 receives and holds substrate 2 transferred from left transfer member 13a (substrate receiving process in Step ST1 shown in FIG. 4A and FIG. 9) and an ACF adhesion operation is started. In the ACF adhesion operation, first, ACF adhesion operation section 14 causes adhesion stage 32 to move to an operational position from the substrate transfer position (FIG. 4A to FIG. 4B) and causes adhesion support base 43 to receive the rear end portion of substrate 2 from below. Adhesion stage 32 is caused to move in the X-axial direction, and two reference marks 2G (FIG. 2) provided on both right and left end of lower side substrate member 2a of substrate 2 are caused to be positioned in order within an imaging field of downward facing camera 55. In this manner, downward facing camera 55 images, from above, two reference marks 2G, respectively, (in FIG. 10A to FIG. 10B, reference mark imaging process in Step ST2) and information obtained through the imaging is transmitted to an image recognizing section 90a (FIG. 8) of control device 90. Image recognizing section 90a of control device 90 performs image recognition on the basis of the information transmitted from downward facing camera 55.

Reference mark position detecting section 90b (FIG. 8) of control device 90 detects positions (coordinates) of two respective reference marks 2G, on the basis of a result of the image recognition by image recognizing section 90a (that is, on the basis of the information obtained when reference marks 2G are imaged by downward facing camera 55 from above) (reference mark position detecting process in Step ST3). Reference mark position storage 90c (FIG. 8) of control device 90 stores positions of two reference marks 2G detected by reference mark position detecting section 90b.

When reference mark position storage 90c of control device 90 stores the positions of two reference marks 2G, ACF adhesion operation section 14 performs adhesion of ACF 4 to electrode 2d on upper side substrate member 2b by using the following technique, in each substrate 2 held by adhesion stage 32 (ACF adhering process in Step ST4).

Figure 11A:
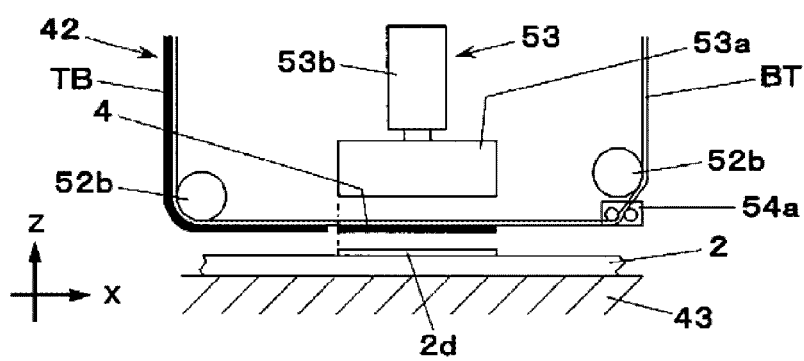
FIGS. 11A to 11D are views depicting movement of an ACF adhesion operation section which is included in the component mounting apparatus according to the embodiment.

In the ACF adhering process, ACF adhesion operation section 14, first, causes adhesion stage 32 to move by adhesion stage moving mechanism 33 and substrate 2 is positioned with respect to pressing tool 53a. Specifically, the left end of electrode 2d is positioned below the left end of pressing tool 53a (FIG. 11A). Here, the position of the left end of electrode 2d is calculated, based on the positions of reference marks 2G detected and stored in the reference mark position detecting process (Step ST3) described above and relative position data of electrode 2d with respect to reference marks 2G stored in advance in first storage 90d of control device 90.

In ACF adhesion operating section 14, when substrate 2 is positioned with respect to pressing tool 53a, tape transporting section 52 of adhesion head 42 supplies and transports tape member TB, cutter 52c is operated so as to make notches on ACF 4 at regular intervals, and ACF 4 having a predetermined length is formed on base tape BT. When ACF 4 having the predetermined length is formed on base tape BT, ACF adhesion operating section 14 causes tape transporting section 52 to operate and performs positioning of ACF 4 with respect to substrate 2 (FIG. 11A). Specifically, the adhering surface of ACF 4 faces electrode 2d up and down and the rear end (left end) thereof in the transport direction is positioned above the left end of electrode 2d (below the left end of pressing tool 53a).

Figure 11B:
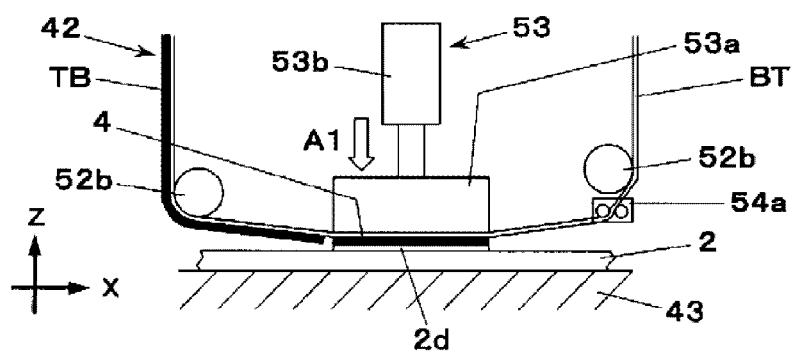

In ACF adhesion operating section 14, when ACF 4 is positioned with respect to substrate 2, pressing tool 53a is caused to be lowered by tool lifting/lowering cylinder 53b (arrow A1 shown in FIG. 11B). In this manner, ACF 4 is pressed to substrate 2 for each base tape BT and adheres to electrode 2d.

Figure 11C:
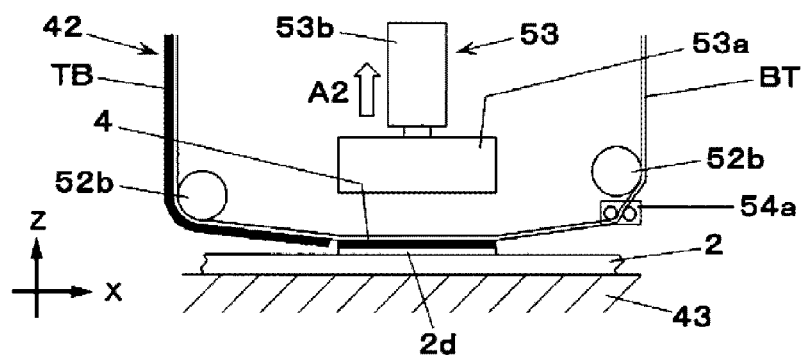
Figure 11D:
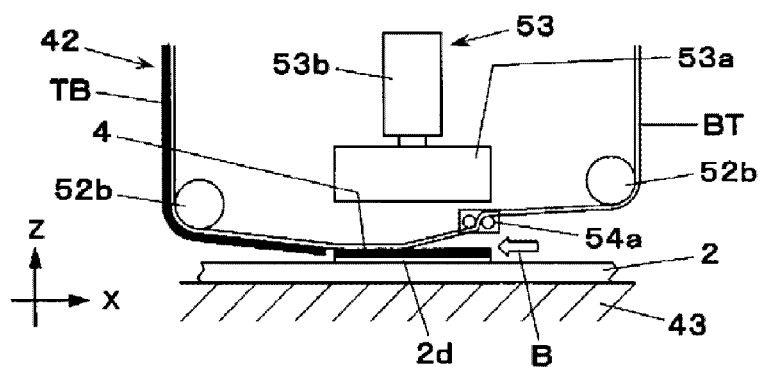

In ACF adhesion operating section 14, when ACF 4 adheres to electrode 2d, pressing tool 53a is caused to be lifted by tool lifting/lowering cylinder 53b (arrow A2 shown in FIG. 11C), peeling cylinder 54b is caused to operate, and peeling member 54a is caused to move in the X-axial direction (arrow B shown in FIG. 11D). In this manner, peeling member 54a moves in the horizontal direction in a state of being fitted in between ACF 4 and base tape BT which adhere to substrate 2 (electrode 2d) and ACF 4 peels off from base tape BT (FIG. 11D). When ACF 4 peels off from base tape BT, ACF adhesion operating section 14 causes peeling cylinder 54b to operate, and peeling member 54a returns to its original position. In this manner, ACF adhering process (Step ST4) ends.

Figure 12A:
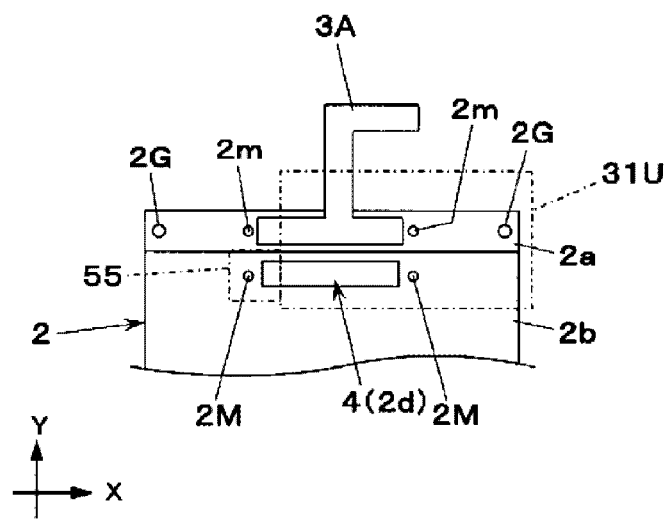
FIGS. 12A and 12B are plan views illustrating states in which an ACF which adheres to the substrate and an upper side mark provided on the substrate are imaged by the downward facing camera of the ACF adhesion section which is included in the component mounting apparatus according to the embodiment.
Figure 12B:
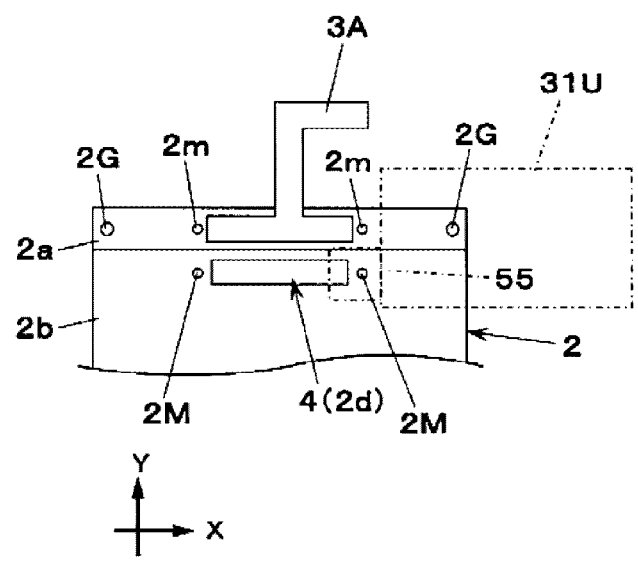

ACF adhesion operating section 14 performs the operations (Step ST2 to Step ST4) from the reference mark imaging process to the ACF adhering process, described above, on two respective substrates 2 held by adhesion stage 32. When the operations described above are performed on two respective substrates 2, ACF adhesion operating section 14 causes adhesion stage 32 to move in the X-axial direction by adhesion stage moving mechanism 33 and the right and left end portions of ACF 4 adhering to substrate 2 are caused to be positioned in order within the imaging field of downward facing camera 55. In this manner, downward facing camera 55 images, from above, the respective right and left end portions of ACF 4 with upper side mark 2M positioned in the vicinity of the respective end portions (in FIG. 12A to FIG. 12B, ACF end portions and upper side mark imaging process in Step ST5 shown in FIG. 9), and information obtained through the imaging is transmitted to image recognizing section 90a of control device 90. Image recognizing section 90a of control device 90 performs image recognition on the basis of the information transmitted from downward facing camera 55.

Determining section 90c (FIG. 8) of control device 90 performs an adhesion inspection of ACF 4, on the basis of a result of the image recognition by image recognizing section 90a (that is, on the basis of the information obtained when the end portions of ACF 4 are imaged by downward facing camera 55 from above) (adhesion inspection process in Step ST6). Specifically, this adhesion inspection is performed by determining whether or not ACF 4 adhering to upper side substrate member 2b is positioned on electrode 2d (at a position between the pair of upper side marks 2M).

In addition, upper side mark position detecting section 90f (FIG. 8) of control device 90 detects positions (coordinates) of upper side marks 2M, on the basis of a result of the image recognition by image recognizing section 90a described above (that is, on the basis of the information obtained when upper side marks 2M are imaged by downward facing camera 55 from above) (upper side mark position detecting process in Step ST7). When upper side mark position detecting section 90f detects positions of upper side marks 2M, first relative positional relationship calculating section 90g (FIG. 8) of control device 90 calculates a "relative positional relationship between reference mark 2G and upper side mark 2M", on the basis of the positions of reference marks 2G detected by reference mark position detecting section 90b (stored in reference mark position storage 90c) and the positions of upper side marks 2M detected by upper side mark position detecting section 90f (first relative positional relationship calculating process in Step ST8).

In second storage 90h (FIG. 8) of control device 90, data of the preset "relative positional relationship between reference marks 2G and lower side marks 2m" is stored. Since the reference marks 2G and lower side marks 2m are formed on the same substrate member (lower side substrate member 2a), the "relative positional relationship between reference marks 2G and lower side marks 2m" has been known and it is possible to obtain from design data or the like.

Second relative positional relationship calculating section 90k (FIG. 8) of control device 90 calculates a "relative positional relationship between lower side marks 2m and upper side marks 2M", on the basis of the "relative positional relationship between reference mark 2G and lower side marks 2m" stored in second storage 90h and "the relative positional relationship between reference marks 2G and upper side marks 2M" calculated by first relative positional relationship calculating section 90g (second relative positional relationship calculating process in Step ST9). Data of the "relative positional relationship between lower side marks 2m and upper side marks 2M" calculated in this manner is set as "relative positional relationship data" and is stored in third storage 90m (FIG. 8) of control device 90 as a data storage (relative positional relationship data setting process in Step ST10). The "relative positional relationship between lower side marks 2m and upper side marks 2M", specifically means an "expression for calculating the positions of two upper side marks 2M (thus, the position of electrode 2d), on the basis of the positions (coordinates) of two lower side marks 2m".

In this present embodiment, downward facing camera 55, which is provided in ACF adhering section 31 disposed on the upstream process side from component mounting section 61, images reference mark 2G and upper side mark 2M, and the relative positional relationship data indicating the relative positional relationship between lower side marks 2m and upper side marks 2M is calculated (that is, actually measured) through the imaging (Step ST2 to Step ST10). This is because the relative positional relationship data between lower side marks 2m and upper side marks 2M is obtained for each individual substrate 2, thereby making it possible to reliably calculate the positions of upper side marks 2M, even in a case where there is a difference from a design value in a bonding state between lower side substrate member 2a and upper side substrate member 2b.

ACF adhesion operating section 14 performs the operations (Step ST2 to Step ST10) from the substrate mark imaging process to the relative positional relationship data acquiring process, described above, for two respective substrates 2 held by adhesion stage 32. When the operations described above are performed on two respective substrates 2, ACF adhesion operating section 14 causes adhesion stage 32 to move by adhesion stage moving mechanism 33 such that the adhesion stage returns to the substrate transfer position (FIG. 4A). In this manner, the ACF adhesion operation by ACF adhesion operating section 14 ends.

When the ACF adhesion operation by ACF adhesion operating section 14 ends, substrate transferring section 13 causes center transfer member 13b to move toward the rear side of adhesion stage 32 and causes suction section 22 of center transfer member 13b to perform suction of substrate 2 on adhesion stage 32. Meanwhile, component installation operating section 15 causes right or left installation stage 63 to be positioned at the substrate transfer position in the front region from component mounting section 61. When suction section 22 of center transfer member 13b sucks substrate 2, substrate transferring section 13 causes center transfer member 13b to the right side and substrate 2 sucked to suction section 22 is transferred to installation stage 63.

In component installation operating section 15, installation stage 63 receives and holds substrate 2 transferred from center transfer member 13b (in FIG. 6A, substrate transfer process in Step ST11) and a component installation operation is started. In the component installation operation, component installation operating section 15, first, causes installation stage 63 to move to the operational position from the substrate transfer position and two lower side marks 2m provided on lower side substrate member 2a are positioned within the imaging field of two upward facing cameras 75 (FIG. 6B). When two lower side marks 2m are positioned within the imaging field of two upward facing cameras 75, two upward facing cameras 75 image lower side marks 2m positioned within the imaging field, respectively, from below, respectively (in FIG. 13A, first lower side mark imaging process in Step ST12, in FIG. 14) and information obtained through the imaging is transmitted to image recognizing section 90a of control device 90. Image recognizing section 90a of control device 90 performs image recognition on the basis of the information transmitted from upward facing cameras 75.

First lower side mark position detecting section 90n (FIG. 8) of control device 90 detects positions (coordinates) of the pair of respective lower side marks 2m, on the basis of a result of the image recognition by image recognizing section 90a described above (that is, on the basis of the information obtained when lower side marks 2m are imaged by upward facing camera 75 from below) (first lower side mark position detecting process in Step ST13). When first lower side mark position detecting section 90n detects positions of the pair of respective lower side marks 2m, upper side mark position calculating section 90p (FIG. 8) of control device 90 calculates positions of upper side marks 2M, on the basis of the detected positions of two lower side marks 2m and the preset relative positional relationship data (data of the relative positional relationship between lower side marks 2m and upper side mark 2M) stored in third storage 90m (upper side mark position calculating process in Step ST14).

When upper side mark position calculating section 90p calculates the positions of upper side marks 2M, in component installation operating section 15, posterior mounting component 3B is mounted on electrode 2d (in detail, ACF 4 adhering to electrode 2d), by using the following technique, on respective substrates 2 held by adhesion stage 32 (component mounting process in Step ST15).

Figure 13A:
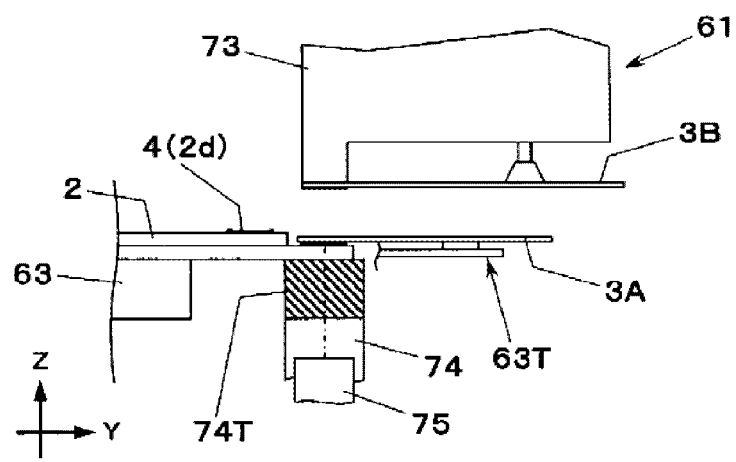
FIGS. 13A to 13C are views depicting movement of a component installation operation section which is included in the component mounting apparatus according to the embodiment.
Figure 13B:
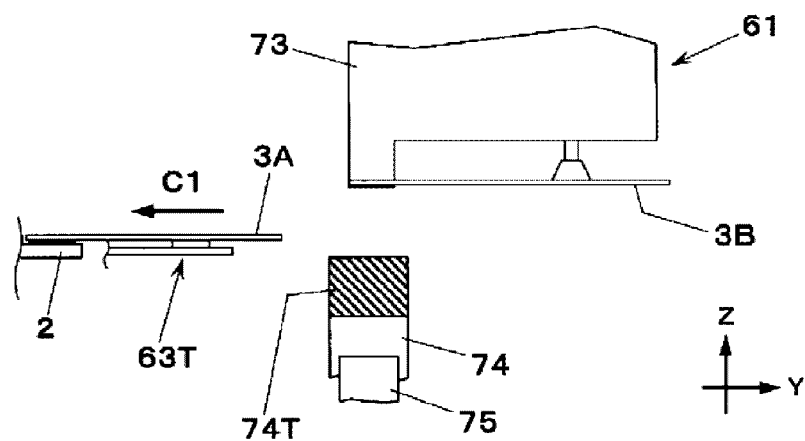
Figure 14:
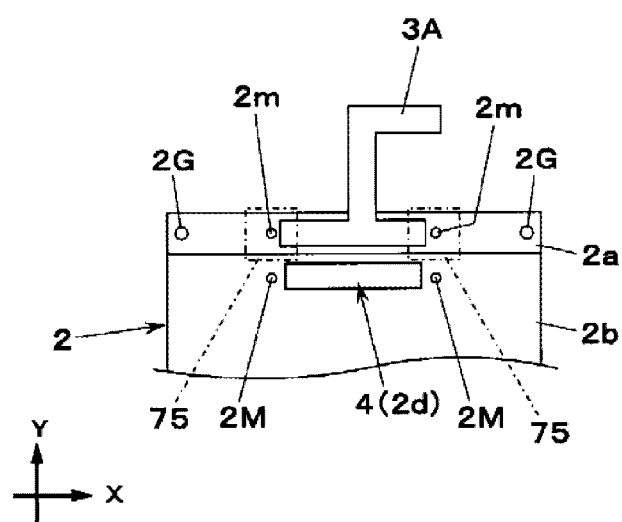
FIG. 14 is a plan view illustrating a state in which a lower side mark provided on the substrate is imaged by an upward facing camera of the component mounting section which is included in the component mounting apparatus according to the embodiment.

In the component mounting process, component installation operating section 15, first, causes mounting head 73 to move by mounting head moving mechanism 72, posterior mounting component 3B supplied by component supplier 71 is sucked to mounting head 73, and mounting head 73 is positioned above mounting support base 74 (FIG. 13A). When mounting head 73 is positioned above mounting support base 74, component installation operating section 15 cases installation stage 63 to move in the front side by installation stage moving mechanism 64 (arrow C1 shown in FIG. 13B) and electrode 2d is temporarily retracted from an upper position of mounting support base 74 (FIG. 13B).

Figure 13C:
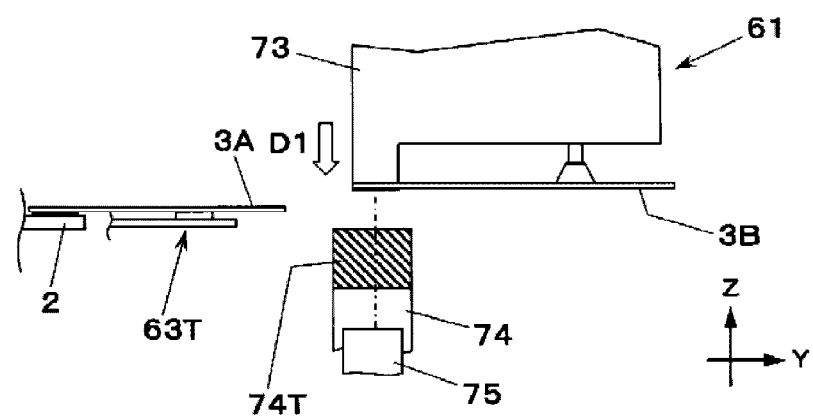

When electrode 2d is temporarily retracted from the upper position of mounting support base 74, component installation operator 15 causes mounting head 73 to be lowered (arrow D1 shown in FIG. 13C) and two component side marks 3M (FIG. 2) provided on posterior mounting component 3B are caused to be positioned within the imaging field of two upward facing cameras 75. Two upward facing cameras 75 image component side marks 3M positioned within the imaging field, respectively, (FIG. 13C) and information obtained through the imaging is transmitted to image recognizing section 90a of control device 90. Image recognizing section 90a of control device 90 performs image recognition on the basis of the information transmitted from upward facing cameras 75.

Figure 15A:
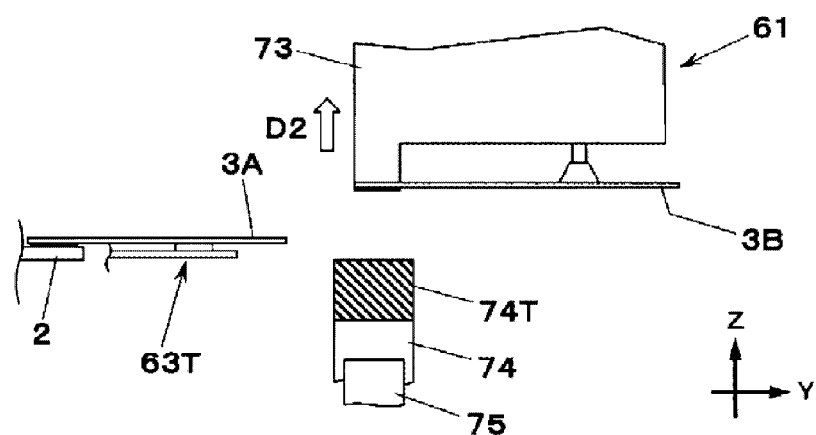
FIGS. 15A to 15C are views depicting movement of the component installation operation section which is included in the component mounting apparatus according to the embodiment.

Component side mark position detecting section 90s (FIG. 8) of control device 90 detects the positions (coordinates) of two component side marks 3M, on the basis of an image recognition result by image recognizing section 90a (that is, on the basis of the information obtained when the component side marks 3M are imaged from below by upward facing cameras 75). When component side mark position detecting section 90s detects the positions of two component side marks 3M, component installation operating section 15 lifts mounting head 73 (arrow D2 in FIG. 15A).

Figure 15B:
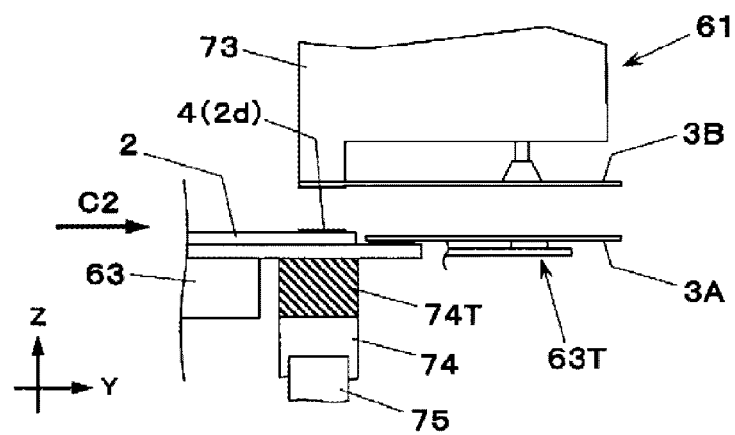

When mounting head 73 is lifted, component installation operating section 15 causes installation stage 63 to be positioned at an operational position by installation stage moving mechanism 64 (arrow C2 shown in FIG. 15B), installation stage 63 is caused to move based on positions of upper side marks 2M which are calculated in advance and component side marks 3M of posterior mounting component 3B, and substrates 2 are positioned with respect to posterior mounting component 3B (FIG. 15B).

Figure 15C:
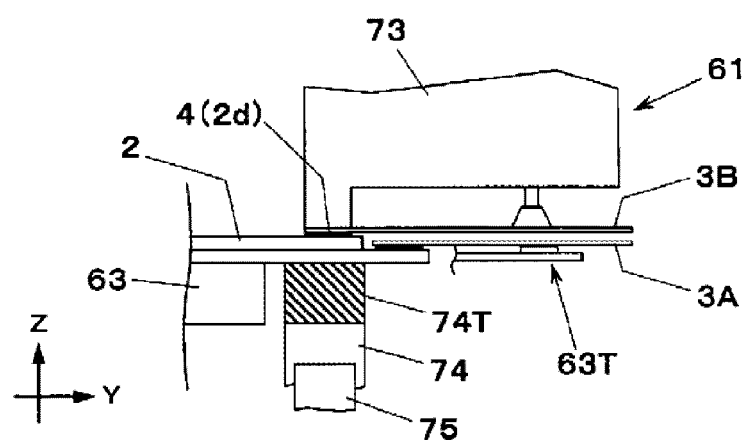

When substrates 2 are positioned with respect to posterior mounting component 3B, component installation operating section 15 causes mounting head 73 to be lowered and posterior mounting component 3B, which is sucked to mounting head 73, is pressed to ACF 4 on upper side substrate member 2b (FIG. 15C). At this time, a pressing force of mounting head 73 is supported by mounting support base 74. In this manner, posterior mounting component 3B is mounted on electrode 2d. When posterior mounting component 3B is mounted on substrate 2, component installation operating section 15 is caused to lift mounting head 73. In this manner, a component mounting process (Step ST15) ends.

In component mounting apparatus 1 in this present embodiment, mounting head 73 mounts posterior mounting component 3B on upper side substrate member 2b, on the basis of the positions of component side marks 3M detected by component side mark position detecting section 90s, and the positions of upper side marks 2M calculated by upper side mark position calculating section 90p.

Component installation operating section 15 performs the operations (Step ST12 to Step ST15) from the first lower side mark imaging process to the component mounting process, described above, for two respective substrates 2 held by installation stage 63. When the posterior mounting component 3B is mounted on two substrates 2, component installation operating section 15 causes installation stage 63 to move in the X-axial direction by installation stage moving mechanism 64, two substrates 2 are positioned above bonding support base 82 (in FIG. 7A an FIG. 16A, substrate moving process in Step ST16). By using the following technique, posterior mounting component 3B mounted on electrode 2d is pressed to be attached to the upper surface of upper side substrate member 2b (component pressure-bonding process in Step ST17).

Figure 16A:
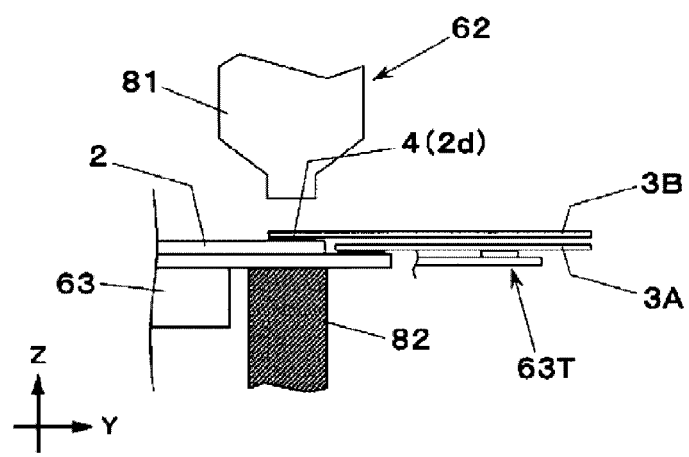
FIGS. 16A to 16C are views depicting movement of the component installation working section which is included in the component mounting apparatus according to the embodiment.
Figure 16B:
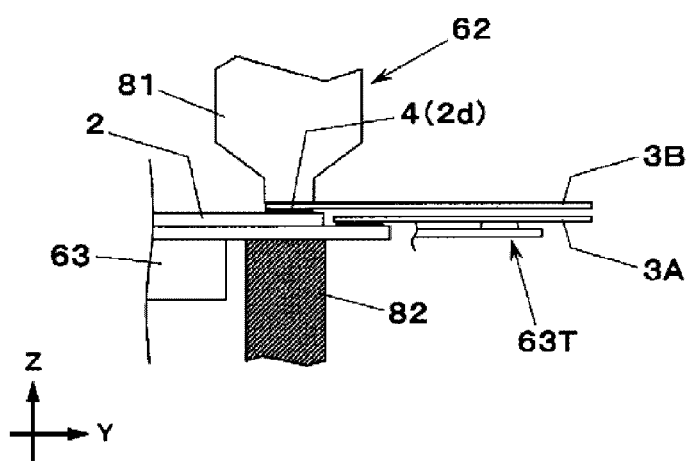
Figure 16C:
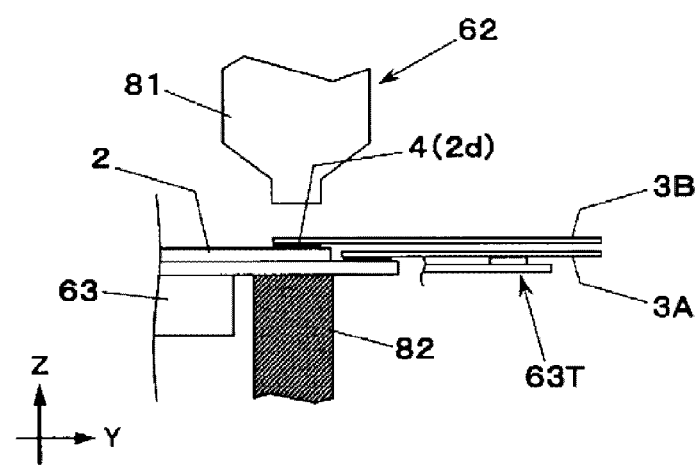

In the component pressure-bonding process, component installation operating section 15, first, causes installation stage 63 to move on the basis of the positions of upper side marks 2M calculated in the upper side mark position calculating process (Step ST14) described above and performs positioning of substrate 2 with respect to bonding head 81. In the positioning of substrate 2, electrode 2d, on which posterior mounting component 3B is mounted, is positioned below bonding head 81. When the positioning of substrate 2 is completed, component installation operating section 15 causes bonding head 81 to be lowered, posterior mounting component 3B mounted on substrate 2 is pressed to bonding support base 82 for each substrate 2, and posterior mounting component 3B is pressed and bonds to upper side substrate member 2b (FIG. 16A to FIG. 16B). When posterior mounting component 3B is pressed and bonds to substrate 2, component installation operator 15 causes bonding head 81 to be lifted (FIG. 16B to FIG. 16C).

Component installation operating section 15 performs component pressure-bonding process (Step ST17) described above for two respective substrates 2 held by installation stage 63. When the operation described above is performed for two respective substrates 2, component installation operating section 15 causes installation stage 63 to move by installation stage moving mechanism 64 and the installation stage returns to the substrate transfer position (FIG. 7B). In this manner, component installation operations in component installation operating section 15 end.

When component installation operations in component installation operating section 15 end, substrate transferring section 13 causes right transfer member 13*c* to move toward the rear side of installation stage 63 and substrate 2 on installation stage 63 is caused to be sucked to suction section 22 of right transfer member 13*c*. When substrate 2 is caused to be sucked to suction section 22 of right transfer member 13*c*, substrate transferrer 13 causes right transfer member 13*c* to move to the right side and substrate 2 is transferred to transport stage 16 (substrate delivery process in Step ST18).

Transport stage 16 receives and holds substrate 2 transferred from right transfer member 13*c*. Substrate 2 held by transport stage 16 is transported to another apparatus on the downstream process side from component mounting apparatus 1, by substrate transport unit (not illustrated).

As described above, when a component (posterior mounting component 3B) is mounted on upper side substrate member 2*b*, component mounting apparatus 1 in the present embodiment performs the first lower side mark imaging process (Step ST12) in which lower side mark 2*m* provided on lower side substrate member 2*a* is imaged from below lower side substrate member 2*a* by upward facing camera 75 disposed to have the above-positioned imaging field and the component mounting process (Step ST15) in which the component (posterior mounting component 3B) is mounted on upper side substrate member 2*b*, on the basis of the information obtained in the first lower side mark imaging process and the preset relative positional relationship data (data representing the relative positional relationship between lower side marks 2*m* and upper side marks 2M). To be more specific, the first lower side mark position detecting process (Step ST13) in which the positions of lower side marks 2*m* are detected, on the basis of the information obtained when lower side mark 2*m* is imaged in the first lower side mark imaging process, and upper side mark position calculating process (Step ST14) in which the positions of upper side marks 2M are calculated, on the basis of the positions of the lower side mark 2*m* detected in the first lower side mark position detecting process and the relative positional relationship data are performed. In the component mounting process described above, the component (posterior mounting component 3B) is mounted on upper side substrate member 2*b*, on the basis of the positions of upper side marks 2M calculated in the upper side mark position calculating process.

Accordingly, in component mounting apparatus 1 (component mounting method by component mounting apparatus 1) in the present embodiment, the positions of upper side marks 2M are calculated, on the basis of the positions of lower side marks 2*m* detected through imaging lower side mark 2*m* from below by upward facing camera 75 which is provided in component mounting section 61 and data (relative positional relationship data) indicating the preset relative positional relationship between lower side marks 2*m* and upper side marks 2M (Step ST12 to Step ST14) and it is possible to obtain the position of the upper side mark 2M without imaging upper side mark 2M from above by component mounting section 61. Therefore, it is possible to mount a component (posterior mounting component 3B) on upper side substrate member 2*b* without providing a camera which images upper side mark 2M from above, separately in component mounting section 61.

Here, in the embodiment described above, the relative positional relationship data described above, that is, the data of the relative positional relationship between the lower side marks 2*m* and upper side marks 2M is calculated, on the basis of the "relative positional relationship between reference marks 2G and upper side marks 2M", and the "relative positional relationship between reference marks 2G and lower side marks 2*m*", and a process of the detecting of reference mark 2G is performed; however, it is possible to carry out a procedure in which the process of detecting of reference mark 2G is not performed. FIG. 17 illustrates a configuration of a case (modification example) in which the relative positional relationship data is calculated in the procedure, and the configuration includes second lower side mark position detecting section 90*na* and third relative positional relationship calculating section 90*ga*. Here, second lower side mark position detecting section 90*na* detects the positions of lower side mark 2*m* on the basis of the information obtained when lower side marks 2*m* are imaged from above by downward facing camera 55. In addition, third relative positional relationship calculating section 90*ga* calculates the relative positional relationship between lower side marks 2*m* and upper side marks 2M, on the basis of the position of lower side marks 2*m* detected by the second lower side mark position detector 90*na* and the position of upper side marks 2M detected by upper side mark position detecting section 90*f*. The data of the relative positional relationship between lower side marks 2*m* and upper side marks 2M calculated in third relative positional relationship calculating section 90*ga* is set to be relative positional relationship data. In the case of the configuration, first relative positional relationship calculating section 90*g*, second storage 90*h*, and second relative positional relationship calculating section 90*k* are not needed in the embodiment described above.

Figure 18:
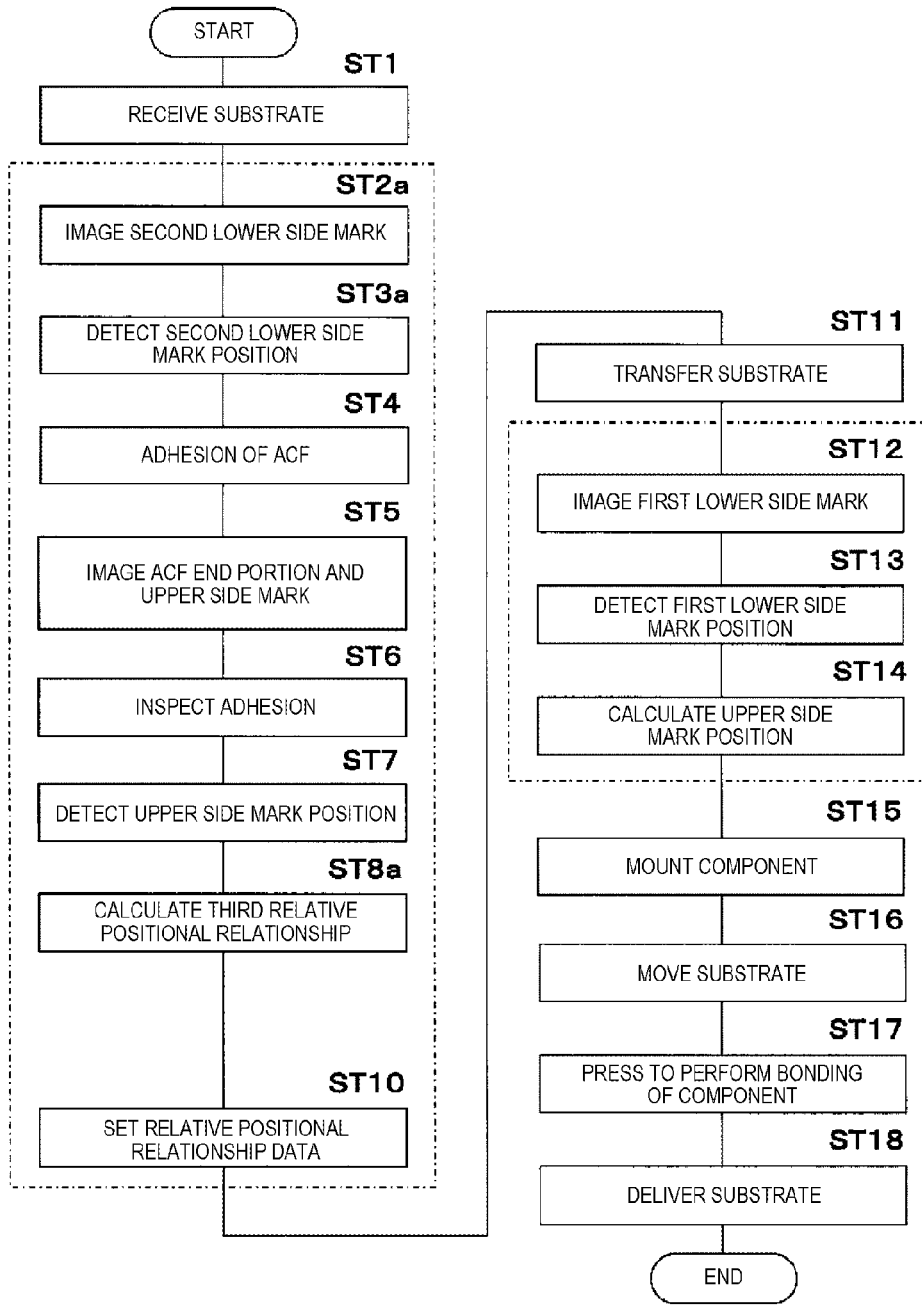
FIG. 18 is a flowchart illustrating flow of a component mounting operation performed by the component mounting apparatus according to the modification example of the embodiment.

In addition, in the case of the configuration, as illustrated in FIG. 18, a second lower side mark imaging process in Step ST2*a* is performed instead of Step ST2 described above and a second lower side mark position detecting process in Step ST3*a* is performed instead of Step ST3 described above. In addition, a third relative positional relationship calculating process in Step ST8*a* is performed instead of Step ST8 and Step ST9 described above. Here, the second lower side mark imaging process of Step ST2*a* is a process of imaging, from above, lower side mark 2*m* by downward facing camera 55, and second lower side mark position detecting process in Step ST3*a* is a process of detecting the positions of lower side marks 2*m*, on the basis of information obtained by imaging lower side marks 2*m* in the second lower side mark imaging process. In addition, the third relative positional relationship calculating process in Step ST8*a* is a process of calculating the relative positional relationship between lower side marks 2*m* and upper side marks 2M, on the basis of the positions of lower side marks 2*m* detected in the second lower side mark position detecting process in Step ST3*a* and the positions of upper side marks 2M detected in the upper side mark position detecting process in the Step ST7. In the relative positional relationship data setting process in Step ST10, the data of the relative positional relationship between lower side marks 2*m* and upper side marks 2M calculated in the third relative positional relationship calculating process is set as the relative positional relationship data.

Further, in the embodiment (including the modification example), the relative positional relationship between lower side marks 2m and upper side marks 2M is individually calculated (actually measured) in respective substrates 2; however, in a state in which it is possible to ignore the occurrence of a shift in the bonding between lower side substrate member 2a and upper side substrate member 2b, there is no need to follow the procedure described above, but the relative positional relationship data may be set regardless of the actual measurement by using design data or the like.

In the component mounting apparatus and the component mounting method in the embodiment, it is possible to mount a component on an upper side substrate member without providing a camera for imaging an upper side mark from above, separately in a component mounting section.

Marks, such as lower side mark 2m, upper side mark 2M, reference mark 2G, component side mark 3M, provided on a surface of a member, such as lower side substrate member 2a, upper side substrate member 2b, and the component (posterior mounting component 3B), include not only articles attached to the surface of the member, but also articles, such as a recess provided in the surface of the member, which appears on the surface of the member.

What is claimed is:

1. A component mounting method comprising:
   providing a substrate which includes a lower side substrate member, an upper side substrate member provided on an upper surface of the lower side substrate member, a lower side mark provided on the lower side substrate member, and an upper side mark provided on an upper surface of the upper side substrate member;
   imaging the lower side mark from below the lower side substrate member;
   providing relative positional relationship data indicating a predetermined relative positional relationship between the lower side mark and the upper side mark; and
   mounting the component on the upper surface of the upper side substrate member based on the relative positional relationship data and information obtained through said imaging the lower side mark from below the lower side substrate member.

2. The component mounting method according to claim 1, further comprising:
   detecting a position of the lower side mark based on information obtained through said imaging the lower side mark from below the lower side substrate member; and
   calculating a position of the upper side mark based on the relative positional relationship data and the detected position of the lower side mark,
   wherein said mounting the component comprises mounting the component on the upper surface of the upper side substrate member based on the calculated position of the upper side mark.

3. The component mounting method according to claim 1, wherein the substrate further includes a reference mark provided on the lower side substrate, the component mounting method further comprising:
   imaging the reference mark from above the reference mark;
   detecting a position of the reference mark based on information obtained through said imaging the reference mark from above the reference mark;
   imaging the upper side mark from above the upper side mark;
   detecting a position of the upper side mark based on information obtained through said imaging the upper side mark from above the upper side mark;
   calculating a relative positional relationship between the reference mark and the upper side mark based on the detected position of the reference mark and the detected position of the upper side mark;
   providing a predetermined relative positional relationship between the reference mark and the lower side mark;
   calculating a relative positional relationship between the lower side mark and the upper side mark based on the predetermined relative positional relationship between the reference mark and the lower side mark and the calculated relative positional relationship between the reference mark and the upper side mark; and
   setting, as the relative positional relationship data, data of the calculated relative positional relationship between the lower side mark and the upper side mark.

4. The component mounting method according to claim 1, further comprising:
   imaging the lower side mark from above the lower side mark;
   detecting a position of the lower side mark based on information obtained through said imaging the lower side mark from above the lower side mark;
   imaging the upper side mark from above the upper side mark;
   detecting a position of the upper side mark based on information obtained through said imaging the upper side mark from above the upper side mark;
   calculating a relative positional relationship between the lower side mark and the upper side mark based on the detected position of the lower side mark and the detected position of the upper side mark; and
   setting, as the relative positional relationship data, data of the calculated relative positional relationship between the lower side mark and the upper side mark.

5. The component mounting method according to claim 1, wherein the component has a component side mark provided thereon, the component mounting method further comprising:
   imaging the component side mark from below the component side mark;
   detecting a position of the component side mark based on information obtained through said imaging the component side mark from below the component side mark,
   wherein said mounting the component comprises mounting the component on the upper surface of the upper side substrate member based on a position of the upper side mark and the detected position of the component side mark.

6. The component mounting method according to claim 1, further comprising
   adhering an anisotropic conductive film (ACF) to the upper surface of the upper side substrate member,
   wherein said mounting the component comprises mounting the component on the upper surface of the upper side substrate member via the adhered ACF.

* * * * *